(12) United States Patent
Loy et al.

(10) Patent No.: US 11,991,938 B2
(45) Date of Patent: May 21, 2024

(54) MEMORY DEVICES AND METHODS OF FORMING MEMORY DEVICES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 585 days.

(21) Appl. No.: 17/136,133

(22) Filed: Dec. 29, 2020

(65) Prior Publication Data
US 2022/0209109 A1    Jun. 30, 2022

(51) Int. Cl.
*H01L 45/00* (2006.01)
*H10B 63/00* (2023.01)
*H10N 70/00* (2023.01)

(52) U.S. Cl.
CPC .......... *H10N 70/841* (2023.02); *H10B 63/00* (2023.02); *H10N 70/021* (2023.02)

(58) Field of Classification Search
CPC ............................................... H10N 70/8265
See application file for complete search history.

(56) References Cited

U.S. PATENT DOCUMENTS

| 9,431,604 B2 | 8/2016 | Liao et al. |
| 9,595,672 B2 | 3/2017 | Liu |
| 10,847,720 B1 | 11/2020 | Loy et al. |
| 2009/0278109 A1 | 11/2009 | Phatak |
| 2023/0078373 A1* | 3/2023 | Kim ............ H10N 70/823 |

OTHER PUBLICATIONS

Non-Final Office Action issued for U.S. Appl. No. 16/802,562 (10 pages) dated May 6, 2021 (for reference purpose only).
Chuang et al., "Effects of Electric Fields on the Switching Properties Improvements of RRAM Device With a Field-Enhanced Elevated-Film-Stack Structure", Journal of the Electron Devices Society, 2018, pp. 622-626, vol. 6, IEEE.

* cited by examiner

*Primary Examiner* — Mark V Prenty
(74) *Attorney, Agent, or Firm* — VIERING JENTSCHURA & PARTNER MBB

(57) ABSTRACT

A memory device may be provided, including a first electrode, an insulating element arranged over the first electrode, a second electrode arranged over the insulating element, a switching layer and a conductive line electrically coupled to the second electrode. Each of the first electrode, the insulating element, and the second electrode may include a first side surface and a second side surface. Centers of the first electrode, the insulating element, and the second electrode may be substantially vertically aligned. The first side surface and the second side surface of the second electrode may be substantially vertically aligned with the first side surface and the second side surface of at least one of the insulating element and the first electrode. The switching layer may be conformal to the first side surfaces and the second side surfaces of the second electrode and the insulating element.

20 Claims, 14 Drawing Sheets

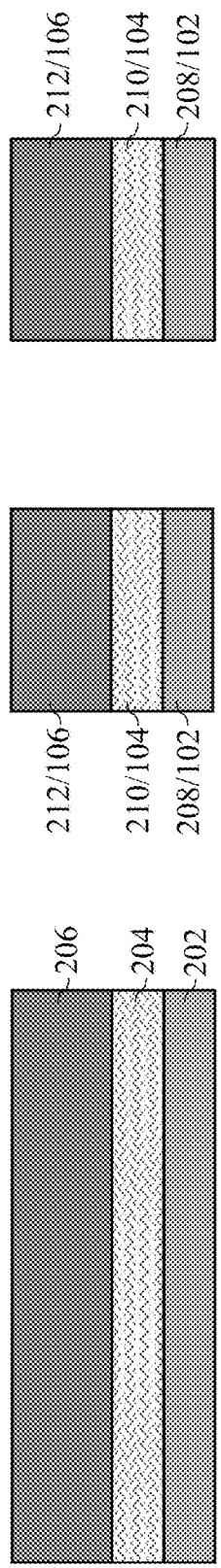
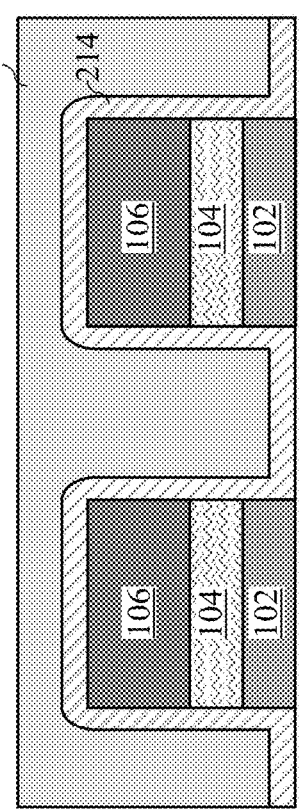
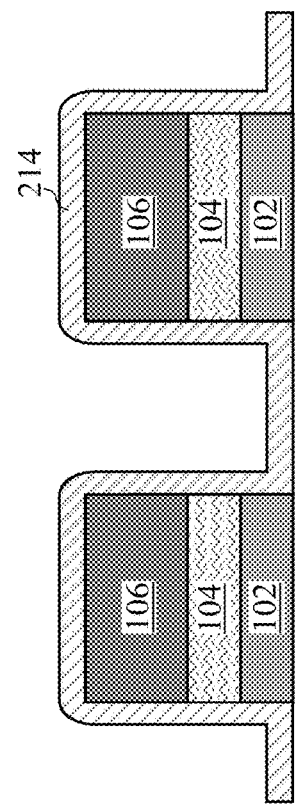
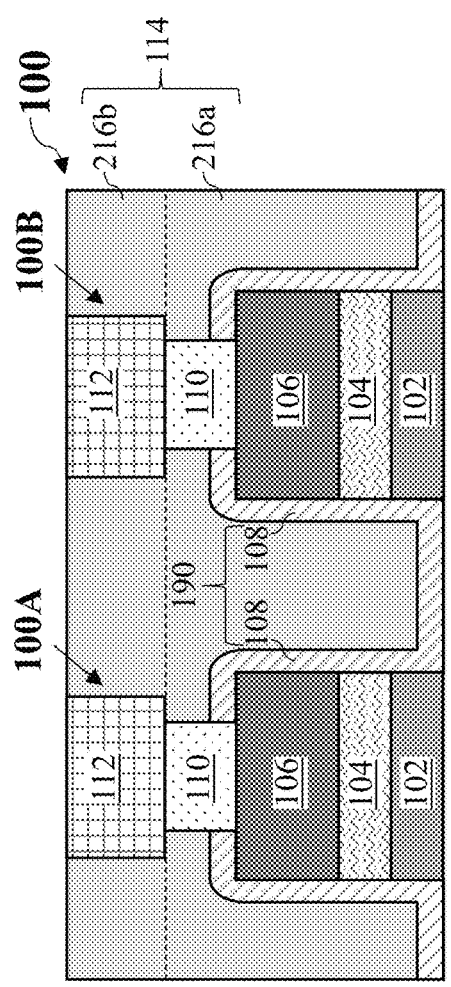

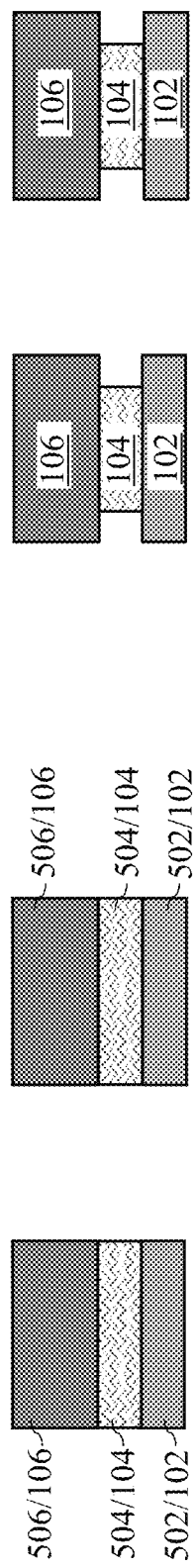
FIG. 5A
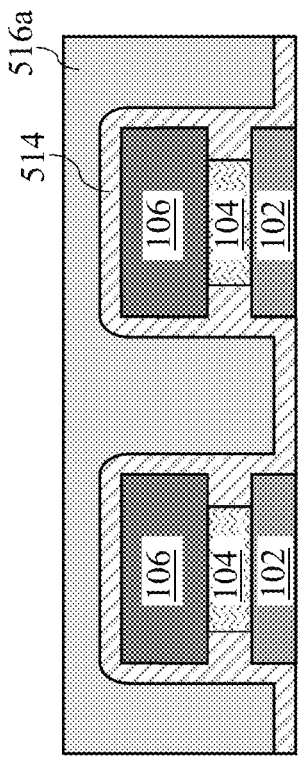
FIG. 5B
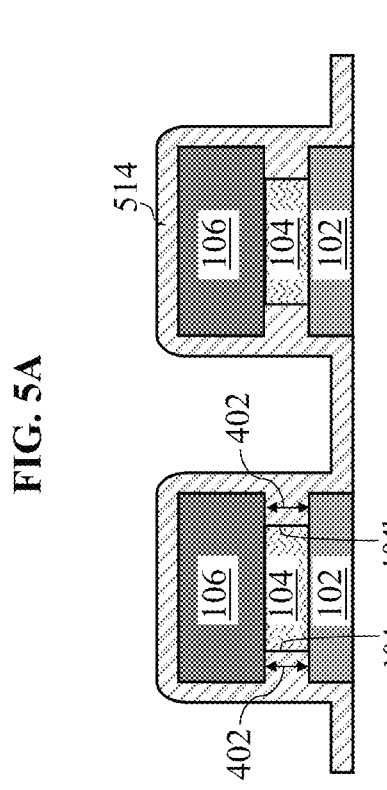
FIG. 5C
FIG. 5D
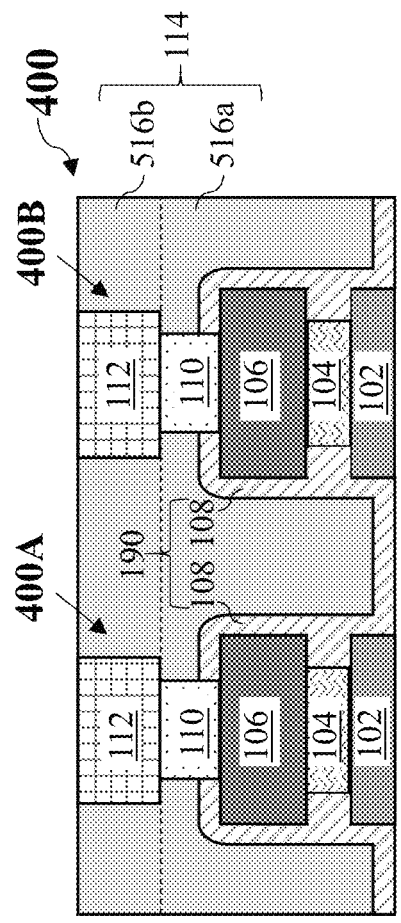
FIG. 5E

MEMORY DEVICES AND METHODS OF FORMING MEMORY DEVICES

TECHNICAL FIELD

The present disclosure relates generally to memory devices and methods of forming the memory devices.

BACKGROUND

Non-volatile memory devices are often used in consumer electronic products such as smart phones and tablets. One type of non-volatile memory device is the resistive random access memory device (RRAM). A RRAM typically uses a switching layer such as a dielectric layer sandwiched between two electrodes. The switching layer is normally insulating. However, upon application of a sufficiently high potential difference between the electrodes, conductive filaments may be formed within the switching layer therebetween. The switching layer thus becomes conductive via the conductive filaments. The switching layer can be made insulating again by applying a sufficiently low voltage difference between the electrodes to break the conductive filaments. A typical RRAM can switch between states based on the resistance of the switching layer. When the switching layer is insulating, the switching layer has a high resistance, and the RRAM may be referred to as being in a high resistance state (HRS). When the switching layer is conductive, the switching layer has a low resistance and the RRAM may be referred to as being in a low resistance state (LRS). To set the RRAM, the RRAM is switched from the HRS to the LRS. To reset the RRAM, the RRAM is switched from the LRS to the HRS.

Conductive filaments are often formed at random across many locations within the switching layer. Such uncontrolled distribution of the conductive filaments can cause the resistance of the switching layer (and hence, the RRAM) to vary greatly across multiple dielectric breakdown events. For example, the resistance of the switching layer when the RRAM is in the FIRS tends to vary greatly over different cycles. This can lead to high device-to-device variability and cycle-to-cycle variability.

Accordingly, it is desirable to provide an improved memory device having reduced variability in its resistance.

SUMMARY

According to various non-limiting embodiments, there may be provided a memory device including a first electrode; an insulating element arranged over the first electrode; a second electrode arranged over the insulating element; where each of the first electrode, the insulating element, and the second electrode may include a first side surface and a second side surface; where centers of the first electrode, the insulating element, and the second electrode may be substantially vertically aligned; and where the first side surface and the second side surface of the second electrode may be substantially vertically aligned with the first side surface and the second side surface of at least one of the insulating element and the first electrode; a switching layer conformal to the first side surfaces and the second side surfaces of the second electrode and the insulating element; and a conductive line electrically coupled to the second electrode.

According to various non-limiting embodiments, there may be provided a memory structure including a plurality of memory devices, where each memory device may include: a first electrode; an insulating element arranged over the first electrode; a second electrode arranged over the insulating element; where each of the first electrode, the insulating element, and the second electrode may include a first side surface and a second side surface; where centers of the first electrode, the insulating element and the second electrode may be substantially vertically aligned; and where the first side surface and the second side surface of the second electrode may be substantially vertically aligned with the first side surface and the second side surface of at least one of the insulating element and the first electrode; a switching layer conformal to the first side surfaces and the second side surfaces of the second electrode and the insulating element; and a conductive line electrically connected to the second electrode.

According to various non-limiting embodiments, there may be provided a method of fabricating a memory device including: forming a first electrode; forming an insulating element over the first electrode; forming a second electrode over the insulating element; where each of the first electrode, the insulating element, and the second electrode may include a first side surface and a second side surface; where centers of the first electrode, the insulating element and the second electrode may be substantially vertically aligned; and where the first side surface and the second side surface of the second electrode may be substantially vertically aligned with the first side surface and the second side surface of at least one of the insulating element and the first electrode; forming a switching layer conformal to the first side surfaces and the second side surfaces of the second electrode and the insulating element; and forming a conductive line electrically connected to the second electrode.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIGS. 2A to 2E show simplified cross-sectional views illustrating a method of fabricating the memory structure of FIG. 1 according to various non-limiting embodiments;

FIGS. 5A to 5E show simplified cross-sectional views illustrating a method of fabricating the memory structure of FIG. 4 according to various non-limiting embodiments;

DETAILED DESCRIPTION

Figure 1:
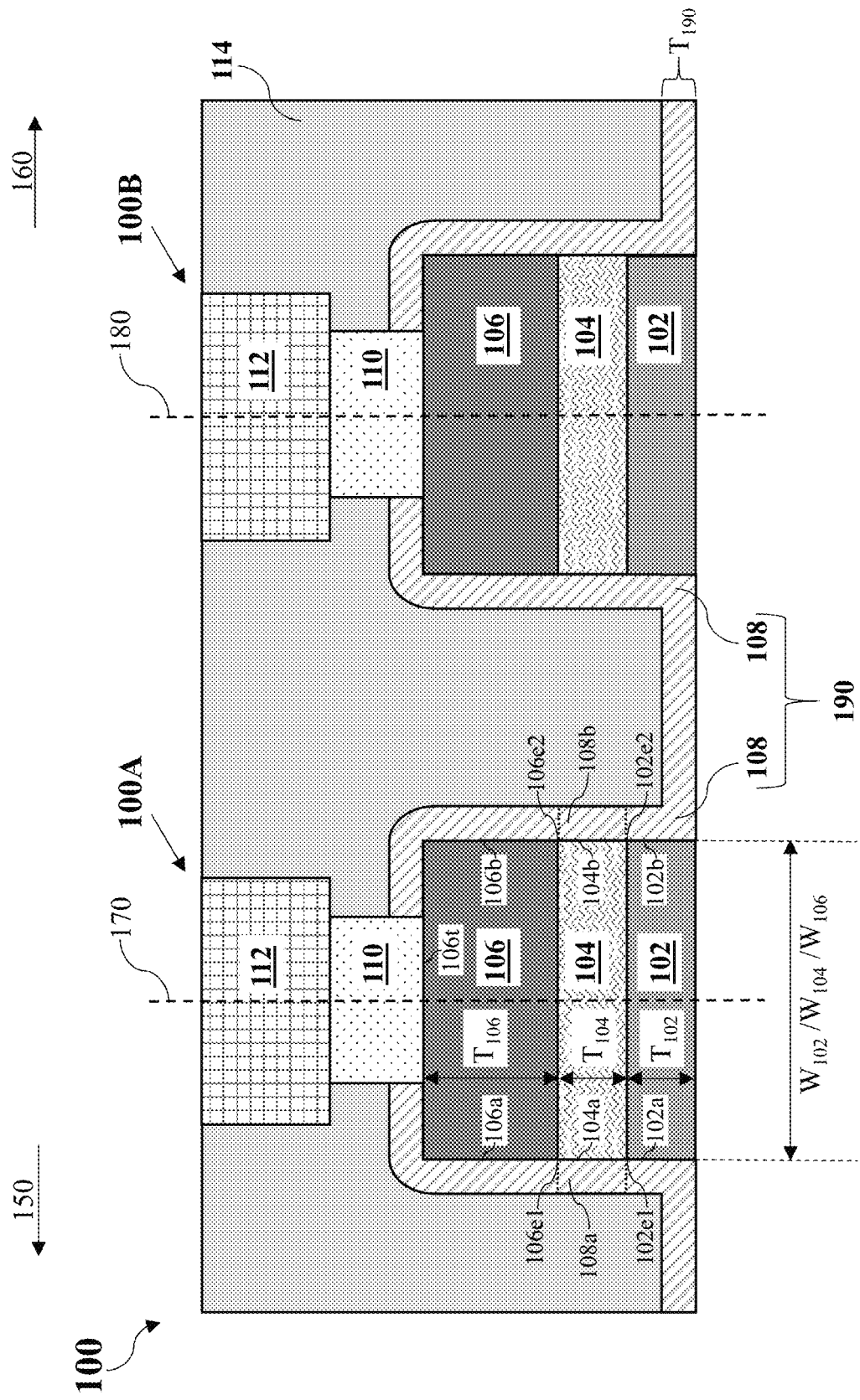
FIG. 1 shows a simplified cross-sectional view of a memory structure including a plurality of memory devices according to various non-limiting embodiments.

The embodiments generally relate to semiconductor devices. More particularly, some embodiments relate to memory structures including at least one memory device, for instance, at least one non-volatile memory device such as a RRAM device in a non-limiting example. The memory structures may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry. Further, "substantially aligned" means largely aligned within normal tolerances of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a memory structure 100 according to various non-limiting embodiments. As shown in FIG. 1, the memory structure 100 may include a plurality of memory devices including a first memory device 100A and a second memory device 100B. The second memory device 100B may be similar to the first memory device 100A and hence, the common features are labelled with the same reference numerals. To avoid cluttering the figure, some parts of the memory devices 100A, 100B are labelled only for the first memory device 100A.

Each memory device 100A, 100B may be a RRAM device and may be a one-bit device. Accordingly, the memory structure 100 in FIG. 1 may be a two-bit structure. The memory structure 100 may be arranged over a base insulating layer (not shown in FIG. 1), where the base insulating layer may be an inter-layer dielectric layer (ILD).

As shown in FIG. 1, each memory device 100A, 100B may include a first electrode 102. The first electrode 102 may be referred to as a bottom electrode or an inert electrode. The first electrode 102 may be cuboidal, and may include a first side surface 102a and a second side surface 102b. As shown in FIG. 1, the first side surface 102a may face a first direction 150 and the second side surface 102b may face a second direction 160 opposite to the first direction 150. The first electrode 102 may include electrode material, for example, inert electrode material, such as, but not limited to, ruthenium (Ru), platinum (Pt), titanium nitride (TiN), tantalum nitride (TaN), alloys thereof or combinations thereof.

Each memory device 100A, 100B may also include an insulating element 104 arranged over the first electrode 102. The insulating element 104 may be referred to as a hard mask element. Similarly, the insulating element 104 may be cuboidal and may include a first side surface 104a facing the first direction 150 and a second side surface 104b facing the second direction 160. The insulating element 104 may include electrically insulating material, such as, but not limited to, various oxides and nitrides, for example, silicon oxide ($SiO_x$), tantalum oxide ($TaO_x$), aluminium oxide ($AlO_x$), silicon nitride ($Si_3N_4$), or combinations thereof.

In addition, each memory device 100A, 100B may further include a second electrode 106 arranged over the insulating element 104. The second electrode 106 may be referred to as a top electrode or an active electrode. The second electrode 106 may also be cuboidal, and may include a first side surface 106a facing the first direction 150 and a second side surface 106b facing the second direction 160. The second electrode 106 may include electrode material for example, active electrode material, such as, but not limited to, tantalum (Ta), hafnium (Hf), titanium (Ti), copper (Cu), silver (Ag), cobalt (Co), tungsten (W), alloys thereof or combinations thereof.

In various non-limiting embodiments, centers of the first electrode 102, the insulating element 104 and the second electrode 106 may be substantially vertically aligned. Further, the first side surface 106a and the second side surface 106b of the second electrode 106 may be respectively substantially vertically aligned with the first side surface 102a, 104a and the second side surface 102b, 104b of at least one of the insulating element 104 and the first electrode 102 (in other words, the insulating element 104, the first electrode 102, or both the insulating element 104 and the first electrode 102).

For example, in the memory structure 100 as shown in FIG. 1, centers of the first electrode 102, the insulating element 104 and the second electrode 106 of the first memory device 100A may be substantially vertically aligned along a first vertical axis 170; whereas, centers of the first electrode 102, the insulating element 104 and the second electrode 106 of the second memory device 100B may be substantially vertically aligned along a second vertical axis 180. In addition, in each of the memory devices 100A, 100B, the first side surface 106a of the second electrode 106 may be substantially vertically aligned with the first side surface 104a of the insulating element 104 and may also be substantially vertically aligned with the first side surface 102a of the first electrode 102; whereas, the second side surface 106b of the second electrode 106 may be substantially vertically aligned with the second side surface 104b of the insulating element 104 and may also be substantially vertically aligned with the second side surface 102b of the first electrode 102.

As shown in FIG. 1, in each memory device 100A, 100B, a thickness $T_{102}$ of the first electrode 102 may be approximately equal to a thickness $T_{104}$ of the insulating element 104; whereas, a thickness $T_{106}$ of the second electrode 106 may be greater than the thicknesses $T_{102}$, $T_{104}$. However, the thicknesses $T_{102}$, $T_{104}$, $T_{106}$ may differ from that shown in FIG. 1. For example, the thicknesses $T_{102}$, $T_{104}$, $T_{106}$ may alternatively be approximately equal. The thickness $T_{102}$ may range from about 5 nm to about 10 nm, the thickness $T_{104}$ may range from about 5 nm to about 10 nm and the thickness $T_{106}$ may range from about 5 nm to about 30 nm. Further, in each memory device 100A, 100B, a width $W_{102}$ of the first electrode 102, a width $W_{104}$ of the insulating element 104 and a width $W_{106}$ of the second electrode 106 may be approximately equal. For example, the widths $W_{102}$, $W_{104}$, $W_{106}$ may each range from about 50 nm to about 100 nm.

Referring to FIG. 1, each memory device 100A, 100B in the memory structure 100 may further include a switching layer 108 arranged over the second electrode 106. The switching layer 108 may be conformal to the first side surfaces 106a, 104a and the second side surfaces 106b, 104b of the second electrode 106 and the insulating element 104. The switching layer 108 may further be conformal to the first side surface 102a and the second side surface 102b of the first electrode 102. For example, as shown in FIG. 1, the switching layer 108 may include a first part 108a conformal to the first side surface 104a of the insulating element 104, where the first part 108a may be arranged over a first top edge 102e1 of the first electrode 102. The switching layer 108 may further include a second part 108b conformal to the second side surface 104b of the insulating element 104, where the second part 108b may be arranged over a second top edge 102e2 of the first electrode 102. The first and second parts 108a, 108b of the switching layer 108 may also be arranged under a first bottom edge 106e1 and a second bottom edge 106e2 of the second electrode 106, respectively. This may allow formation of conductive filaments within the switching layer 108 between the first and second electrodes 102, 106. In addition, the switching layer 108 may be additionally conformal to a top surface 106t of the second electrode 106 and may also extend along a top surface of the base insulating layer (not shown in FIG. 1) over which the memory structure 100 may be arranged.

Referring to FIG. 1, the switching layer 108 of each memory device 100A, 100B may be a part of a switching liner 190 extending continuously across the plurality of memory devices 100A, 100B. The switching liner 190 may be a thin liner. For example, a thickness $T_{190}$ of the switching liner 190 may be less than 15 nm and in some non-limiting embodiments, may range from about 5 nm to about 15 nm. The switching liner 190 (in other words, the switching layer 108 of each memory device 100A, 100B) may include switching material such as, but not limited to, magnesium oxide (MgO), tantalum oxide ($TaO_2$), hafnium oxide ($HfO_2$), titanium oxide ($TiO_2$), aluminum oxide ($AlO_2$), silicon dioxide ($SiO_2$) or combinations thereof.

Each memory device 100A, 100B may further include a conductive line 112 electrically coupled to the second electrode 106. For example, as shown in FIG. 1, each memory device 100A, 100B may include a connector 110 arranged between the conductive line 112 and the second electrode 106. The connector 110 may be connected to the conductive line 112 and may extend through the switching layer 108 to connect to the second electrode 106. The connectors 110 and the conductive lines 112 may include electrically conductive material, such as, but not limited to, aluminum, copper, tungsten, alloys thereof, or combinations thereof. For example, each connector 110 may be an electrically conductive via, and each conductive line 112 may serve as a bit line of the memory structure 100.

In addition, the memory structure 100 may include an insulating layer 114. The memory devices 100A, 100B (including the first electrodes 102, the insulating elements 104, the second electrodes 106, the switching layers 108, the connectors 110 and the conductive lines 112) may be arranged within the insulating layer 114. The insulating layer 114 may be an inter-layer dielectric (ILD) layer and may include an electrically insulating material, such as, but not limited to, silicon oxide, silicon dioxide, silicon nitride and combinations thereof.

FIGS. 2A to 2E show simplified cross-sectional views illustrating a method of fabricating the memory structure 100 according to various non-limiting embodiments. For clarity of illustration, some reference numerals are omitted from FIGS. 2A to 2E.

Referring to FIG. 2A, the method may include forming a first layer 202 of a first material, forming a second layer 204 of a second material over the first layer 202, and forming a third layer 206 of a third material over the second layer 204. The first material may include inert electrode material, the second material may include electrically insulating material and the third material may include active electrode material.

Referring to FIG. 2B, the method may further include forming first elements 208 from the first layer 202, second elements 210 from the second layer 204 and third elements 212 from the third layer 206. This may be done in a single process. For example, the first, second and third elements 208, 210, 212 may be formed by etching the first, second and third layers 202, 204, 206 in a single etching process, using for example, a photoresist mask. The first elements 208 may be the first electrodes 102, the second elements 210 may be the insulating elements 104 and the third elements 212 may be the second electrodes 106.

Referring to FIG. 2C, the method may further include forming the switching layers 108 by first depositing a liner 214 of switching material along the top surface of the base insulating layer (not shown in FIG. 2C), along the side surfaces 102a, 102b, 104a, 104b, 106a, 106b of the first electrodes 102, the insulating elements 104 and the second electrodes 106, and along the top surfaces 106t of the second electrodes 106. The deposition of the liner 214 may be guided by the first electrodes 102, the insulating elements 104 and the second electrodes 106, and the thickness of the liner 214 may be controllable during the deposition process.

Referring to FIG. 2D, the method may further include forming a first intermediate insulating layer 216a over the liner 214. This may be done by depositing electrically insulating material and smoothing a top surface of the electrically insulating material using for example, a chemical-mechanical polishing (CMP) process.

Referring to FIG. 2E, the method may further include forming the connectors 110 and the conductive lines 112. This may involve a back-end-of-line process. For example, the liner 214 and the first intermediate insulating layer 216a may be etched to form openings/trenches and electrically conductive material may be deposited into the openings/trenches to form the connectors 110. The remaining portion of the liner 214 may form the switching liner 190 (including the switching layers 108). Electrically insulating material may then be deposited over the first intermediate insulating layer 216a to form a second intermediate insulating layer 216b. The second intermediate insulating layer 216b may subsequently be etched to form openings/trenches, and electrically conductive material may be deposited into the openings/trenches to form the conductive lines 112. The remaining portions of the first and second intermediate insulating layers 216a, 216b may form the insulating layer 114.

The above described order for the method is only intended to be illustrative, and the method is not limited to the above specifically described order unless otherwise specifically stated.

Figure 3:
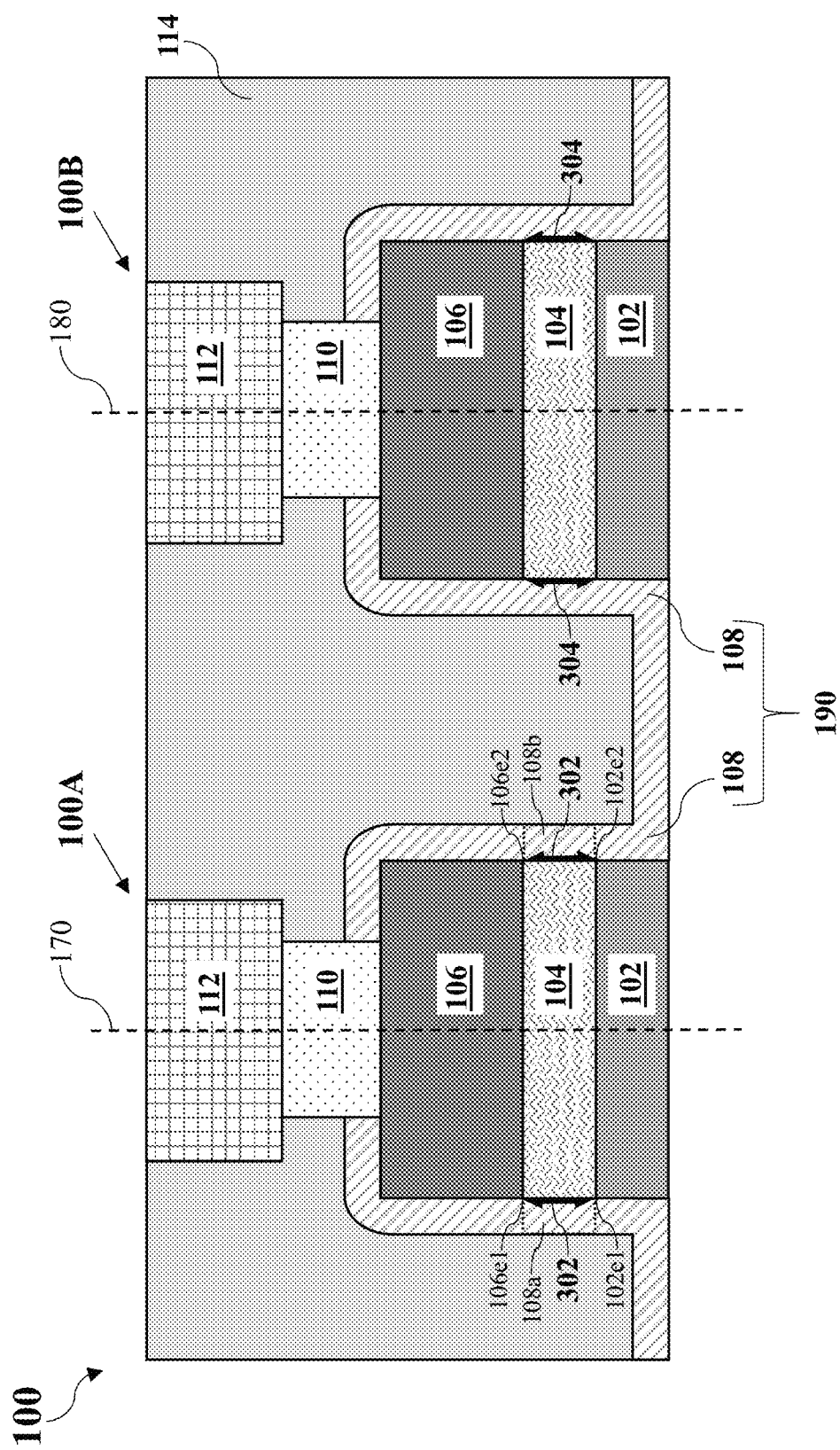
FIG. 3 shows a simplified cross-sectional view of the memory structure of FIG. 1 in operation.

FIG. 3 shows a simplified cross-sectional view of the memory structure 100 in operation. For clarity of illustration, some reference numerals are omitted from FIG. 3.

As mentioned above, the memory structure 100 may be a two-bit memory structure. The first bit of the memory structure 100 may correspond to a state of the first memory device 100A; whereas, the second bit of the memory structure 100 may correspond to a state of the second memory device 100B. To program the first bit of the memory structure 100, a sufficiently large potential difference may be applied between the first and second electrodes 102, 106 of the first memory device 100A to form conductive filaments 302 between these electrodes 102, 106. As shown in FIG. 3, the conductive filaments 302 may be confined between the first top edge 102e1 of the first electrode 102 and the first bottom edge 106e1 of the second electrode 106, and between the second top edge 102e2 of the first electrode 102 and the second bottom edge 106e2 of the second electrode 106. Similarly, to program the second bit of the memory structure 100, a sufficiently large potential difference may be applied between the first and second electrodes 102, 106 of the second memory device 100B to form conductive filaments 304 between these electrodes 102, 106. The conductive filaments 304 may also be confined between the first top edge 102e1 of the first electrode 102 and the first bottom edge 106e1 of the second electrode 106, and between the second top edge 102e2 of the first electrode 102 and the second bottom edge 106e2 of the second electrode 106. Note that although not apparent from FIG. 3, the conductive filaments 302, 304 may be formed anywhere along the edges 102e1, 102e2, 106e1, 106e2 in the respective memory devices 100A, 100B.

Figure 4:
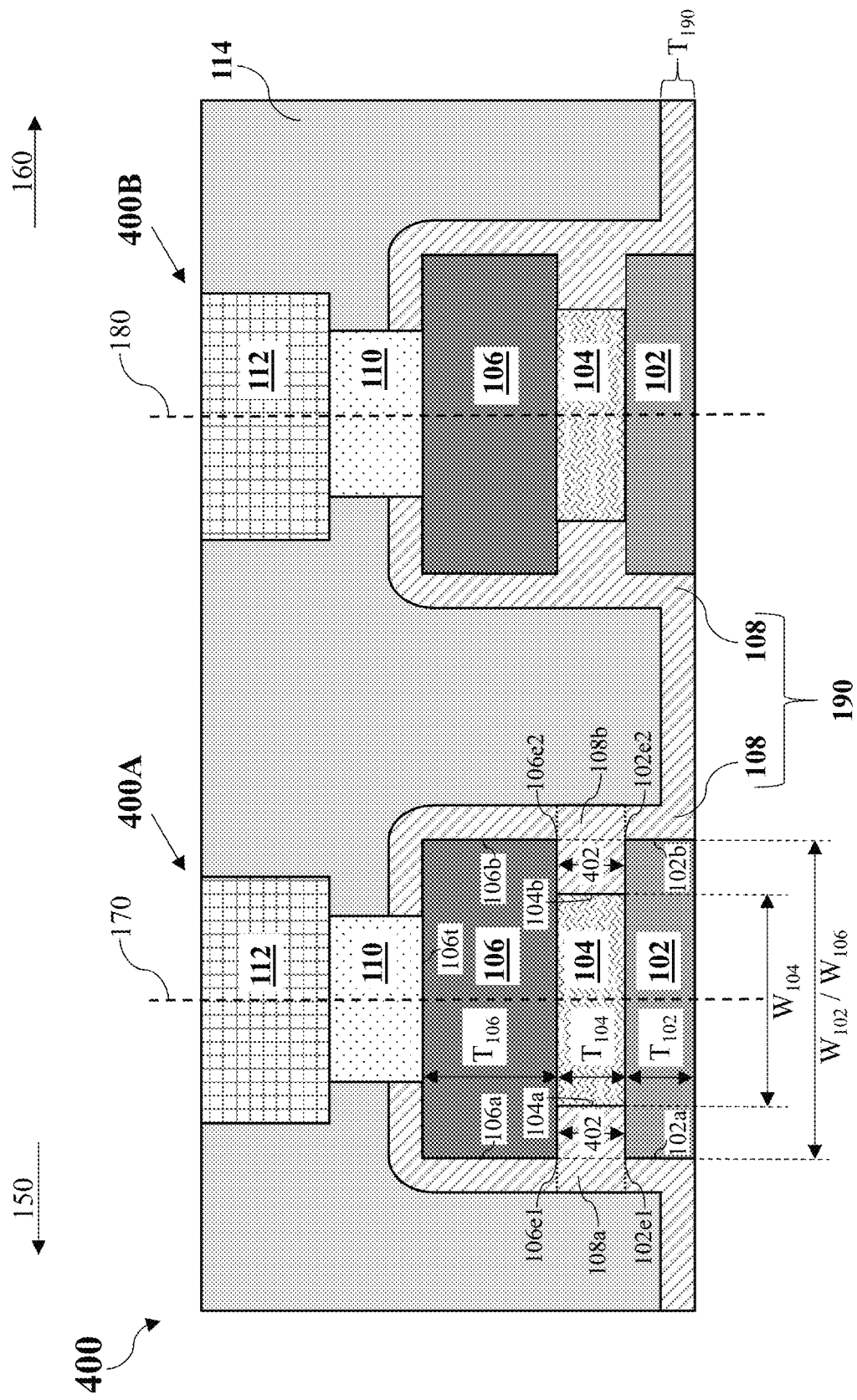
FIG. 4 shows a simplified cross-sectional view of a memory structure including a plurality of memory devices according to alternative non-limiting embodiments.

FIG. 4 shows a simplified cross-sectional view of a memory structure 400 according to alternative non-limiting embodiments. The memory structure 400 may include a first memory device 400A and a second memory device 400B similar to the memory devices 100A, 100B of the memory structure 100, and thus, the common features are labelled with the same reference numerals and need not be discussed.

As shown in FIG. 4, as compared to the memory structure 100, the first electrodes 102, the insulating elements 104, the second electrodes 106 and the switching liner 190 in the memory structure 400 may be arranged in a similar manner and may have thicknesses $T_{102}$, $T_{104}$, $T_{106}$, $T_{190}$ similar to that in the memory structure 100. However, in each memory device 400A, 400B, while the width $W_{102}$ of the first electrode 102 and the width $W_{106}$ of the second electrode 106 may be approximately equal and may be similar to the widths $W_{102}$, $W_{106}$ in the memory structure 100, the width $W_{104}$ of the insulating element 104 may be less than the width $W_{102}$ of the first electrode 102. For example, the width $W_{104}$ in each memory device 400A, 400B may range from about 40 nm to about 80 nm. Therefore, the first and second side surfaces 102a, 102b of the first electrode 102 may be substantially vertically aligned with the first and second side surfaces 106a, 106b of the second electrode 106 respectively, but may be laterally offset from the first and second side surfaces 104a, 104b of the insulating element 104.

Due to the smaller width $W_{104}$ of the insulating element 104, there may be vertical gaps 402 between the first and second electrodes 102, 106 in each memory device 400A, 400B as shown in FIG. 4. The switching layer 108 may extend into these vertical gaps 402. In other words, a portion of the switching layer 108 may be arranged vertically between the first electrode 102 and the second electrode 106, conformal to the first side surface 104a and the second side surface 104b of the insulating element 104. Thus, the switching layer 108 in each memory device 400A, 400B may similarly include a first part 108a conformal to the first side surface 104a of the insulating element 104 and a second part 108b conformal to the second side surface 104b of the insulating element 104. The first part 108a may be arranged over a first top edge 102e1 of the first electrode 102 and under a first bottom edge 106e1 of the second electrode 106, and the second part 108b may be arranged over a second top edge 102e2 of the first electrode 102 and under a second bottom edge 106e2 of the second electrode 106. Similarly, this may allow the formation of conductive filaments within the switching layer 108 between the electrodes 102, 106.

FIGS. 5A to 5E show simplified cross-sectional views illustrating a method of fabricating the memory structure 400 according to various non-limiting embodiments. For clarity of illustration, some reference numerals are omitted from FIGS. 5A to 5E.

Referring to FIG. 5A, the method may include forming a first element 502, a second element 504 and a third element 506, where these elements 502, 504, 506 may be respectively similar to (and their formation may be similar to the formation of) the elements 208, 210, 212 described with reference to FIGS. 2A and 2B. In other words, the first elements 502 may be the first electrodes 102, the second elements 504 may be the insulating elements 104 and the third elements 506 may be the second electrodes 106.

Referring to FIG. 5B, the method may further include reducing a width of each second element 504 (in other words, each insulating element 104). This may be done by removing end portions of each second element 504, using for example, a wet etching process. A width of each end portion removed by the wet etching process may range from about 5 nm to about 10 nm.

Referring to FIG. 5C, the method may further include forming the switching layers 108 by depositing a liner 514 of switching material in a similar manner as the deposition of the liner 214 described with reference to FIG. 2C. However, the liner 514 may extend partially into the vertical gaps 402 between the first and second electrodes 102, 106, such that the liner 514 may be conformal to the side surfaces 104a, 104b of the insulating element 104.

Referring to FIG. 5D, the method may further include forming a first intermediate insulating layer 516a. This may include depositing electrically insulating material over the liner 514 and smoothing a top surface of the electrically insulating material, using for example, a CMP process.

Referring to FIG. 5E, the method may further include forming the connectors 110 and the conductive lines 112. This may be done in a manner similar to that described above with reference to FIG. 2E, where the liner 514 and the first intermediate insulating layer 516a may be etched, and a second intermediate insulating layer 516b may be formed and etched. Similarly, the remaining portion of the liner 514 may form the switching liner 190; whereas, the remaining portions of the first and second intermediate insulating layers 516a, 516b may form the insulating layer 114.

The above described order for the method is only intended to be illustrative, and the method is not limited to the above specifically described order unless otherwise specifically stated.

Figure 6:
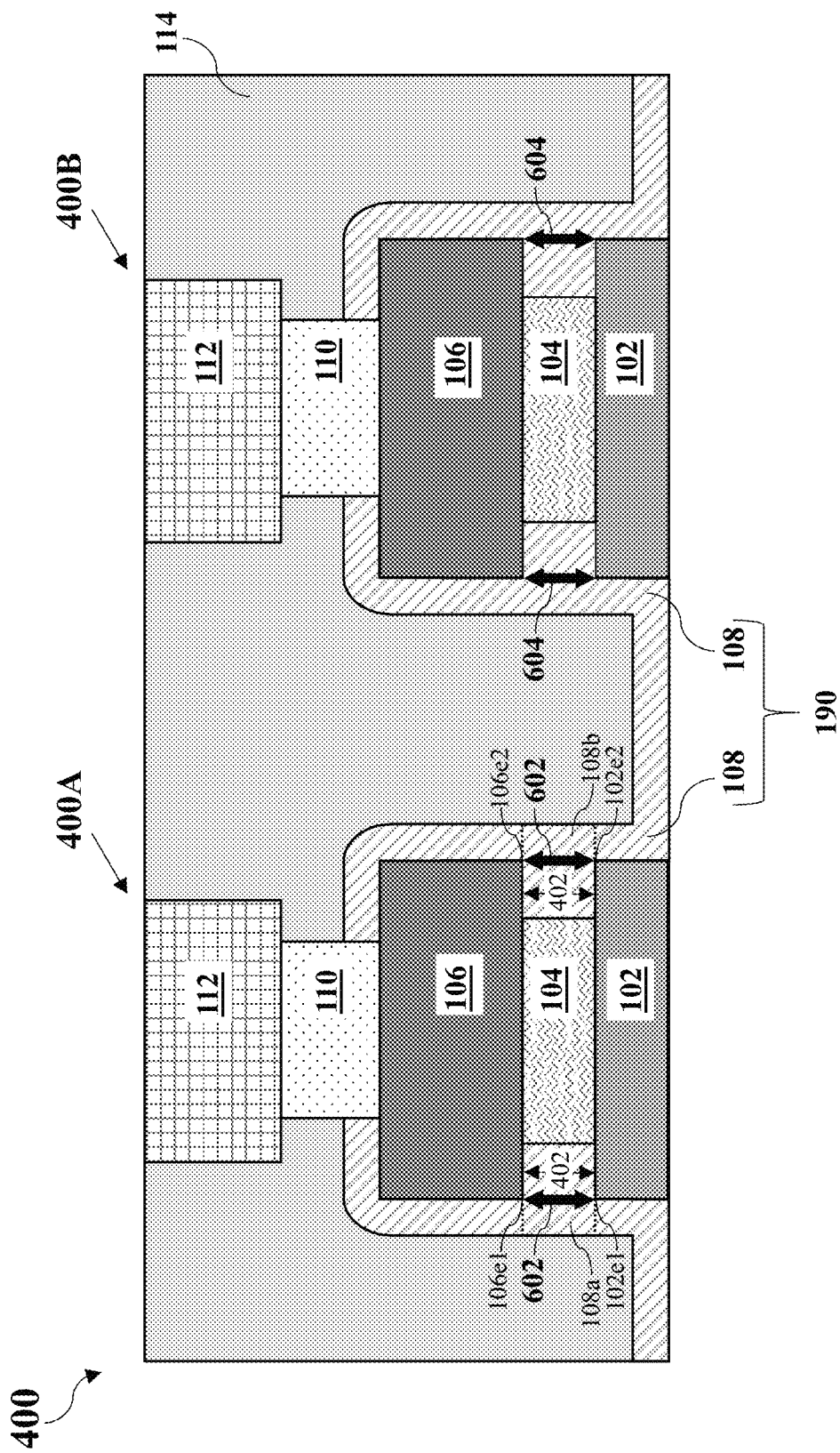
FIG. 6 shows a simplified cross-sectional view of the memory structure of FIG. 4 in operation.

FIG. 6 shows a simplified cross-sectional view of the memory structure 400 in operation. For clarity of illustration, some reference numerals are omitted from FIG. 6. As shown in FIG. 6, the memory structure 400 may operate in a similar manner as the memory structure 100, with the conductive filaments 602, 604 confined between the edges 102e1, 106e1 of the electrodes 102, 106 and between the edges 102e2, 106e2 of the electrodes 102, 106 in each memory device 400A, 400B. However, the conductive filaments 602, 604 formed in the memory structure 400 may be larger than the conductive filaments 302, 304 formed in the memory structure 100, as the extension of the switching layer 108 into the vertical gaps 402 may provide a larger region for the formation of the filaments 602, 604.

Figure 7:
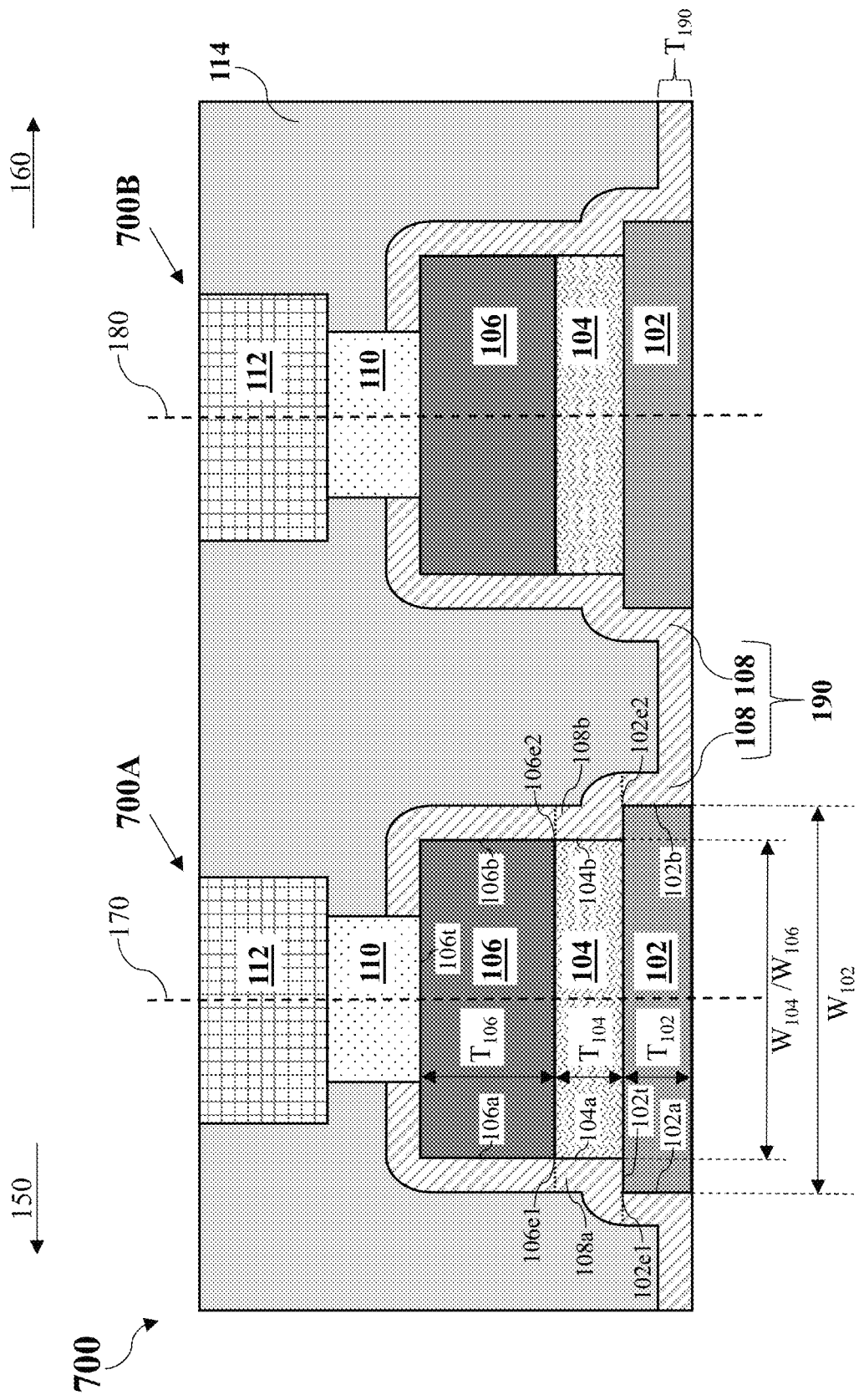
FIG. 7 shows a simplified cross-sectional view of a memory structure including a plurality of memory devices according to alternative non-limiting embodiments.

FIG. 7 shows a simplified cross-sectional view of a memory structure 700 according to alternative non-limiting embodiments. The memory structure 700 may include a first memory device 700A and a second memory device 700B similar to the memory devices 100A, 100B of the memory structure 100, and thus, the common features are labelled with the same reference numerals and need not be discussed.

As shown in FIG. 7, as compared to the memory structure 100, the first electrodes 102, the insulating elements 104, the second electrodes 106 and the switching liner 190 in the memory structure 700 may be arranged in a similar manner and may have thicknesses $T_{102}$, $T_{104}$, $T_{106}$, $T_{190}$ similar to that in the memory structure 100. However, in each memory device 700A, 700B, while the width $W_{104}$ of the insulating element 104 and the width $W_{106}$ of the second electrode 106 may be approximately equal, the width $W_{102}$ of the first electrode 102 may be greater than the width $W_{106}$ of the second electrode 106. For example, the width $W_{102}$ of the first electrode 102 in each memory device 700A, 700B may range from about 50 nm to about 100 nm; whereas, the widths $W_{104}$, $W_{106}$ of the insulating element 104 and the second electrode 106 may each range from about 40 nm to about 80 nm. Therefore, the first and second side surfaces 104a, 104b of the insulating element 104 may be substantially vertically aligned with the first and second side surfaces 106a, 106b of the second electrode 106 respectively, but may be laterally offset from the first and second side surfaces 102a, 102b of the first electrode 102 respectively.

The switching layer 108 may similarly be conformal to the side surfaces 102a, 102b, 104a, 104b, 106a, 106b of the electrodes 102, 106 and the insulating element 104, and to the top surface 106t of the second electrode 106. As shown in FIG. 7, in each memory device 700A, 700B, the first electrode 102 may extend beyond the first and second side surfaces 104a, 104b of the insulating element 104, such that the switching layer 108 may additionally be conformal to a top surface 102t of the first electrode 102. The switching layer 108 may thus also include a first part 108a conformal to the first side surface 104a of the insulating element 104 and a second part 108b conformal to the second side surface 104b of the insulating element 104, where the first part 108a may be arranged over a first top edge 102e1 of the first electrode 102 and under a first bottom edge 106e1 of the second electrode 106, and the second part 108b may be arranged over a second top edge 102e2 of the first electrode 102 and under a second bottom edge 106e2 of the second electrode 106. This may similarly allow the formation of conductive filaments within the switching layer 108 between the electrodes 102, 106.

FIGS. 8A to 8F show simplified cross-sectional views illustrating a method of fabricating the memory structure 700 according to various non-limiting embodiments. For clarity of illustration, some reference numerals are omitted from FIGS. 8A to 8F.

Figure 8A:
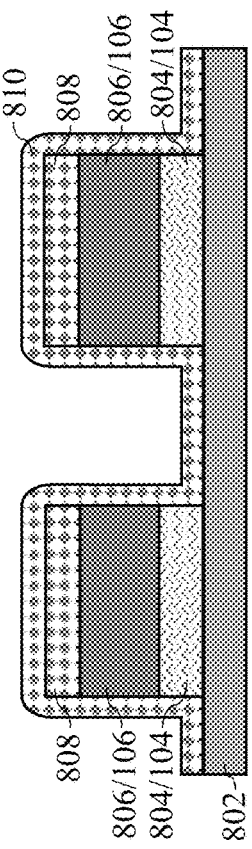
FIGS. 8A to 8F show simplified cross-sectional views illustrating a method of fabricating the memory structure of FIG. 7 according to various non-limiting embodiments.

Referring to FIG. 8A, the method may include forming an electrode layer 802 including an electrode material (e.g. inert electrode material). The method may further include forming first elements 804, second elements 806 and third elements 808 in a manner similar to the formation of the elements 208, 210, 212 described with reference to FIGS. 2A and 2B. For example, the method may include forming a first layer of a first material over the electrode layer 802, forming a second layer of a second material over the first layer, and forming a third layer of a third material over the second layer. The first and third materials may include electrically insulating materials, and the second material may include active electrode material. The third material may be the same as or may be different from the first material. For example, the third material may be an oxide and the first material may be a nitride. The elements 804, 806, 808 may be formed from the first, second and third layers respectively in a single process (for example, by etching these layers in a single etching process). The first elements 804 may be the insulating elements 104, the second elements 806 may be the second electrodes 106 and the third elements 808 may be further insulating elements. The third elements 808 may be referred to as hard mask elements.

Figure 8B:
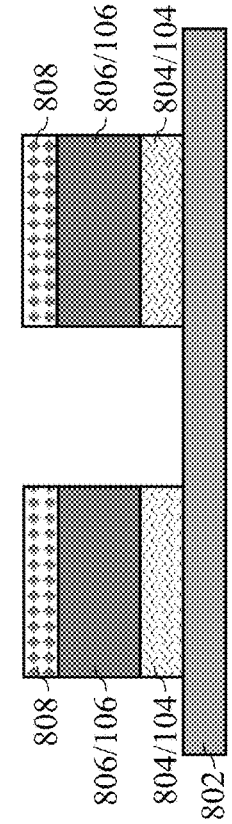

Referring to FIG. 8B, the method may further include forming a liner 810 over the third elements 808, where the liner 810 may be conformal to a top surface of the electrode layer 802, side surfaces of the elements 804, 806, 808 and a top surface of the third element 808. The liner 810 may include an electrically insulating material. For example, the liner 810 may include a same material as the third elements 808. The liner 810, together with the third elements 808, may form an electrically insulating layer that may be referred to as a hard mask layer.

Figure 8C:
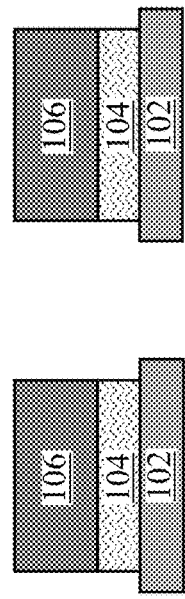

Referring to FIG. 8C, the method may further include forming the first electrodes 102 from the electrode layer 802 with a self-aligned process using the liner 810 as a guide. For example, the electrode layer 802 may be etched and the liner 810 may serve as a mask during this etching process. The third elements 808 and some parts of the liner 810 may also be removed to expose the top surfaces of the second elements 806/second electrodes 106. This removal may be performed together with the etching of the electrode layer 802 in a single process.

Figure 8D:
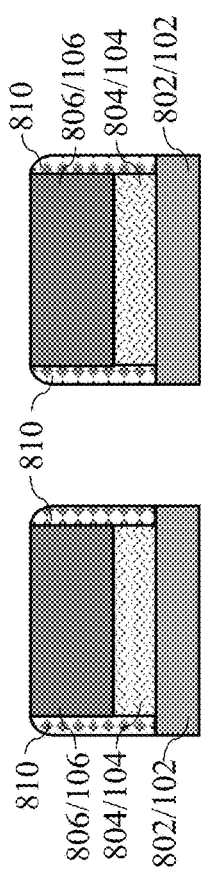

Referring to FIG. 8D, the method may further include removing the remaining parts of the liner 810. This may be done using any process as known to those skilled in the art, such as, but not limited to, a wet etching process.

Figure 8E:
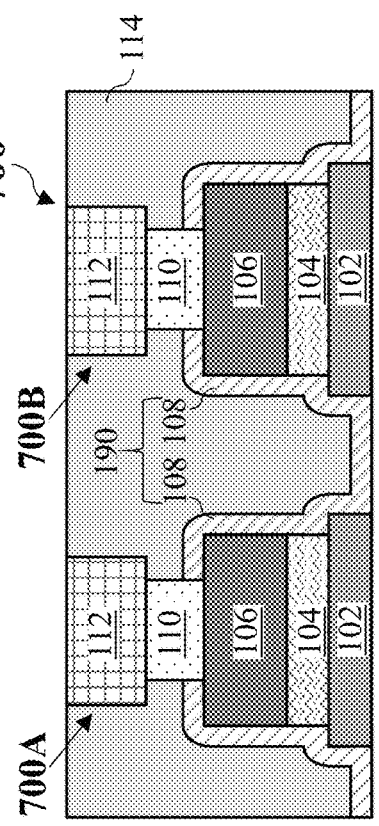

Referring to FIG. 8E, the method may further include forming the switching layers 108 by depositing a liner 814 of switching material in a similar manner as the deposition of the liner 214 described with reference to FIG. 2C. However, the liner 814 may be partially over the first electrodes 102.

Figure 8F:
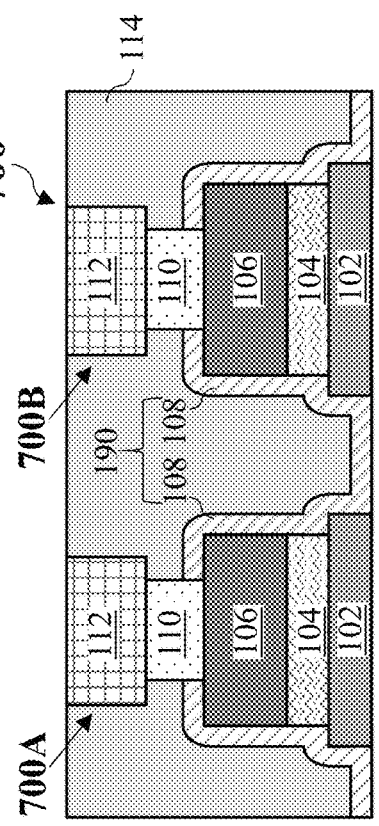

Referring to FIG. 8F, the method may further include forming the switching liner 190 (including the switching layers 108), the connectors 110, the conductive lines 112 and the insulating layer 114 in a manner similar to that described with reference to FIGS. 2D and 2E.

Figure 9:
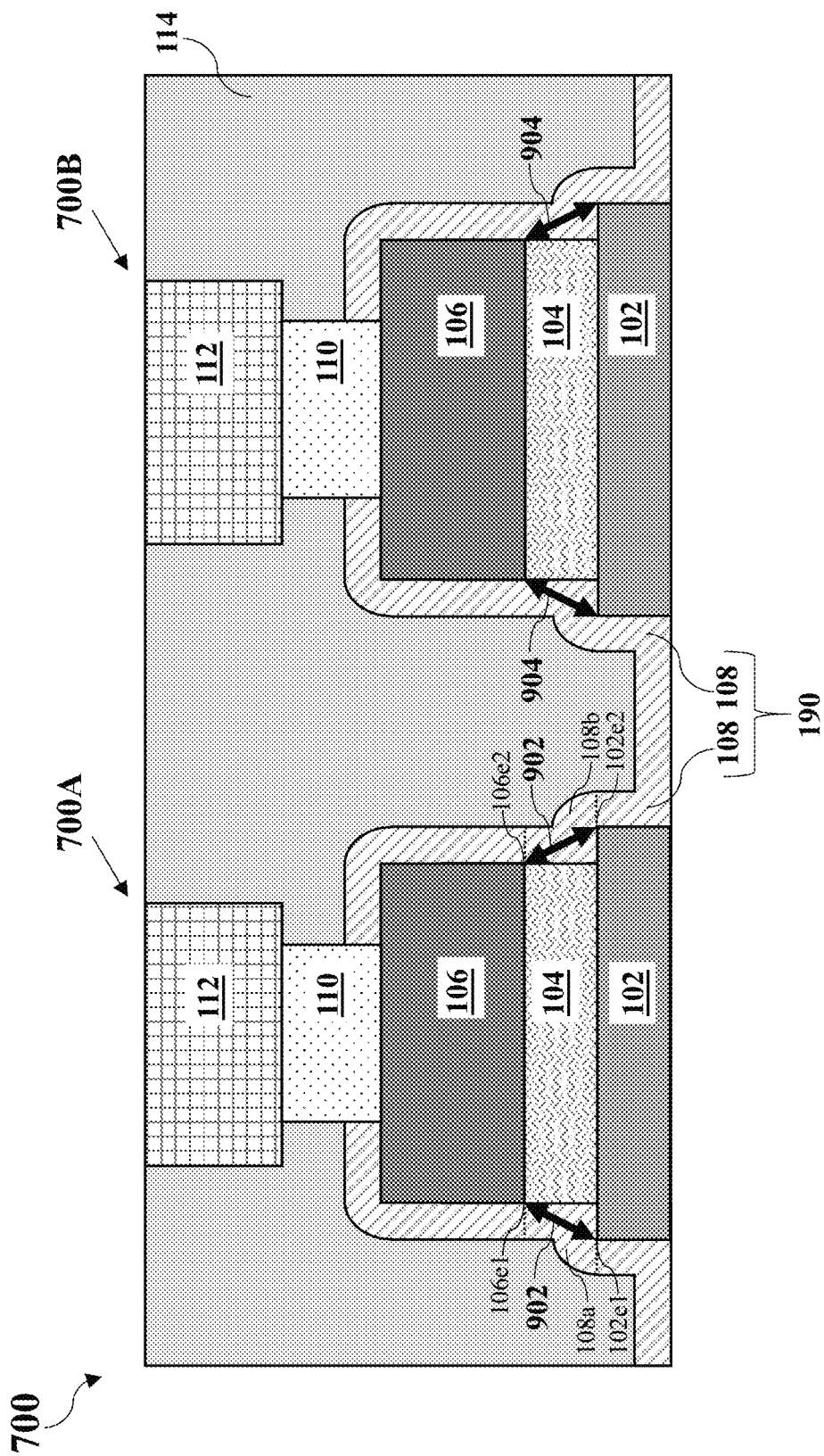
FIG. 9 shows a simplified cross-sectional view of the memory structure of FIG. 7 in operation.

FIG. 9 shows a simplified cross-sectional view of the memory structure 700 in operation. For clarity of illustration, some reference numerals are omitted from FIG. 9. The memory structure 700 may operate in a similar manner as the memory structure 100 (as described above), with the conductive filaments 902, 904 confined between the edges 102e1, 106e1 of the electrodes 102, 106, and between the edges 102e2, 106e2 of the electrodes 102, 106 in each memory device 900A, 900B. However, while the conductive filaments 302, 304 may be formed along shorter vertical paths in the memory structure 100, the conductive filaments 902, 904 may be formed along longer diagonal paths in the memory structure 700. Accordingly, the conductive filaments 902, 904 formed in the memory structure 700 may be longer than those formed in the memory structure 100.

Figure 10:
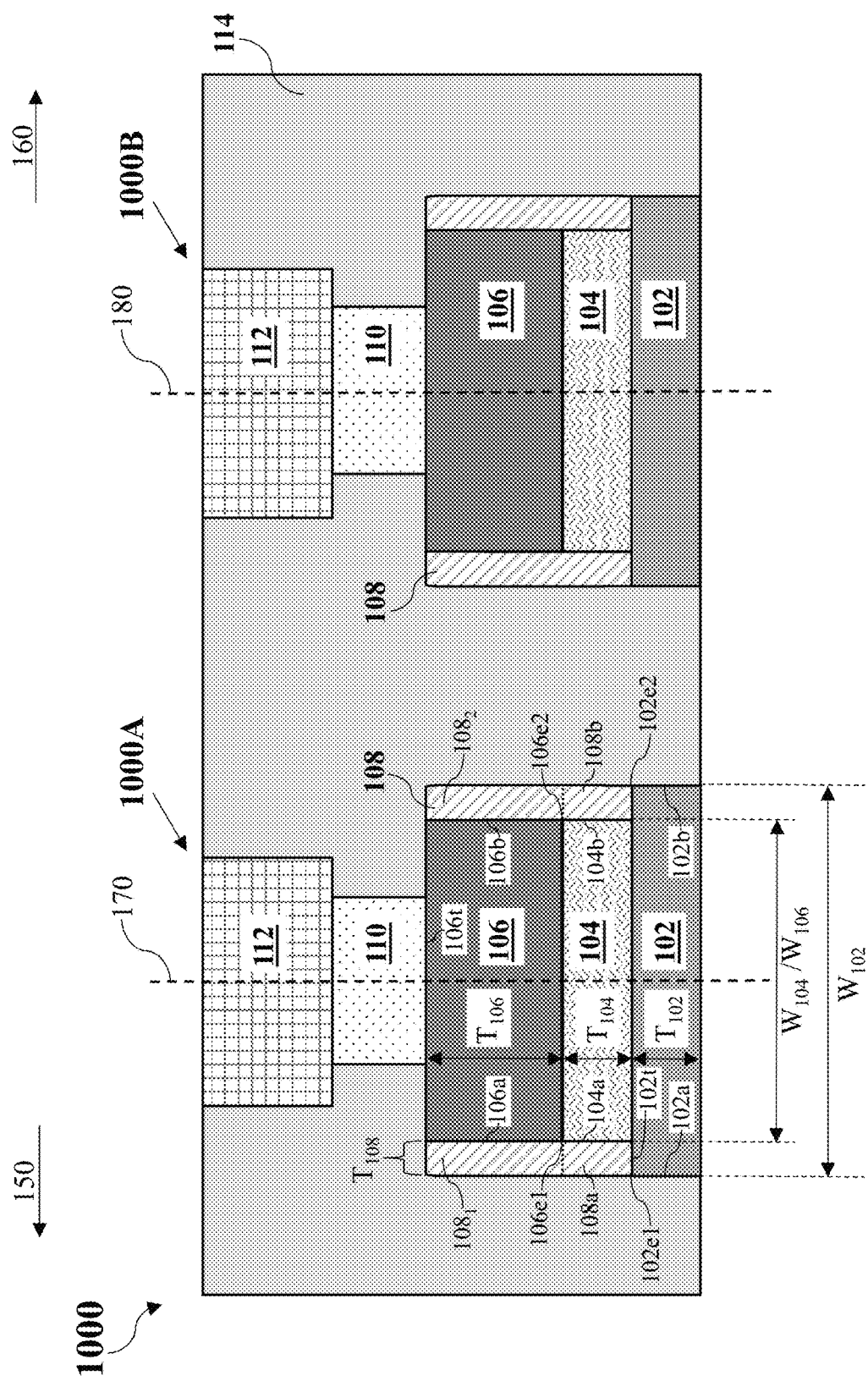
FIG. 10 shows a simplified cross-sectional view of a memory structure including a plurality of memory devices according to alternative non-limiting embodiments.

FIG. 10 shows a simplified cross-sectional view of a memory structure 1000 according to alternative non-limiting embodiments. The memory structure 1000 may include a first memory device 1000A and a second memory device 1000B similar to the memory devices 100A, 100B of the memory structure 100, and thus, the common features are labelled with the same reference numerals and need not be discussed.

As shown in FIG. 10, the memory structure 1000 may be similar to the memory structure 700 in that the width $W_{104}$ of the insulating element 104 and the width $W_{106}$ of the second electrode 106 may be approximately equal, and the width $W_{102}$ of the first electrode 102 may be greater than the width $W_{106}$ of the second electrode 106. The widths $W_{102}$, $W_{104}$, $W_{106}$ may be similar to those in the memory structure 700.

However, in each memory device 1000A, 1000B in the memory structure 1000, the switching layer 108 may be entirely over the first electrode 102. Unlike in the memory structures 100, 400, 700, the switching layer 108 may be conformal to a top surface 102t of the first electrode 102, but not to a top surface 106t of the second electrode 106. Therefore, the top surfaces 106t of the second electrodes 106 in the memory structure 1000 may be exposed. The switching layer 108 of each memory device 1000A, 1000B may include first and second separate portions $108_1$, $108_2$ as shown in FIG. 10. A thickness $T_{108}$ of each portion $108_1$, $108_2$ of the switching layer 108 may be similar to the thickness $T_{190}$ in the memory structure 100. The first portion $108_1$ of the switching layer 108 may include a first part 108a conformal to the first side surface 104a of the insulating element 104a. The second portion $108_2$ of the switching layer 108 may include a second part 108b conformal to the second side surface 104b of the insulating element 104. The first part 108a may be arranged over a first top edge 102e1 of the first electrode 102 and under a first bottom edge 106e1 of the second electrode 106, and the second part 108b may be arranged over a second top edge 102e2 of the first electrode 102 and under a second bottom edge 106e2 of the second electrode 106. This may similarly allow the formation of conductive filaments within the switching layer 108 between the electrodes 102, 106. In addition, instead of a continuous liner 190, an electrically insulating material (part of the insulating layer 114) may be arranged between the switching layers 108 of the adjacent memory devices 1000A, 1000B.

FIGS. 11A to 11E show simplified cross-sectional views illustrating a method of fabricating the memory structure 1000 according to various non-limiting embodiments. For clarity of illustration, some reference numerals are omitted from FIGS. 11A to 11E.

Figure 11A:
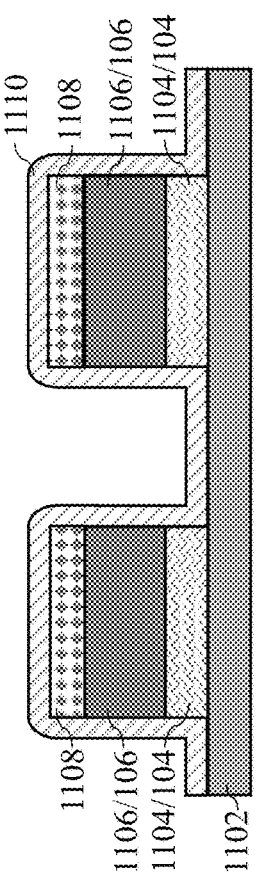
FIGS. 11A to 11E show simplified cross-sectional views illustrating a method of fabricating the memory structure of FIG. 10 according to various non-limiting embodiments.

Referring to FIG. 11A, the method may include forming an electrode layer 1102 including an electrode material (e.g. inert electrode material) and forming first, second and third elements 1104, 1106, 1108. The electrode layer 1102 and the elements 1104, 1106, 1108 may be similar to the electrode layer 802 and the elements 804, 806, 808 described with reference to FIG. 8A. The formation of this layer 1102 and the elements 1104, 1106, 1108 may also be similar to that described with reference to FIG. 8A. Accordingly, the first elements 1104 may be the insulating elements 104, the second elements 1106 may be the second electrodes 106 and the third elements 1108 may be further insulating elements.

Figure 11B:
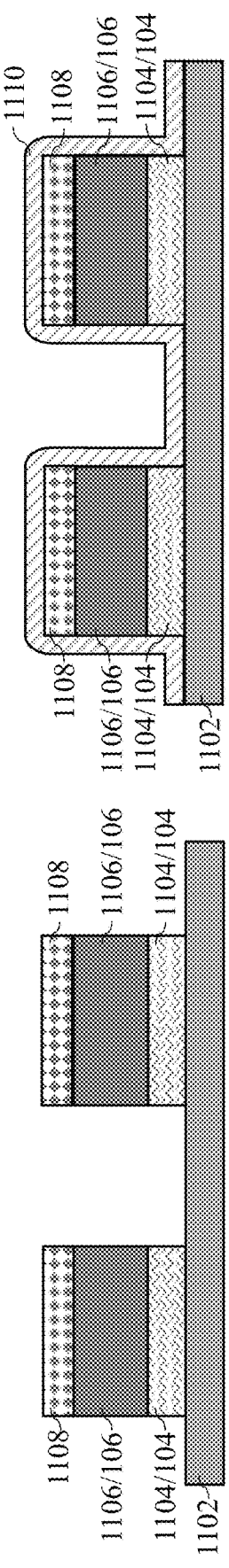

Referring to FIG. 11B, the method may further include forming a liner 1110 over the third elements 1108 in a manner similar to the formation of the liner 810 described with reference to FIG. 8B. However, the liner 1110 in FIG. 11B may include a switching material instead of an electrically insulating material.

Figure 11C:
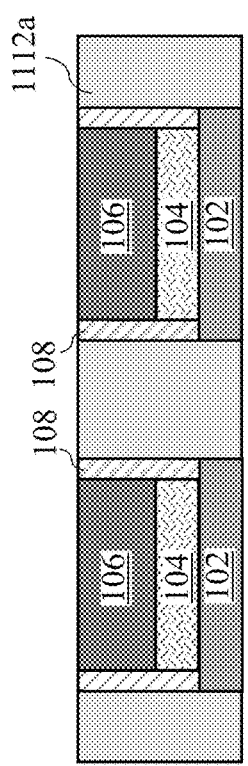

Referring to FIG. 11C, the method may further include forming the first electrodes 102 from the electrode layer 1102 with a self-aligned process using the liner 1110 as a guide. The first electrodes 102 may be formed by removing parts of the electrode layer 1102 in a manner similar to that described with reference to FIG. 8C. For example, the third elements 1108 and some parts of the liner 1110 may also be removed together with the parts of the electrode layer 1102 in a single process (e.g. a single etching process).

Figure 11D:
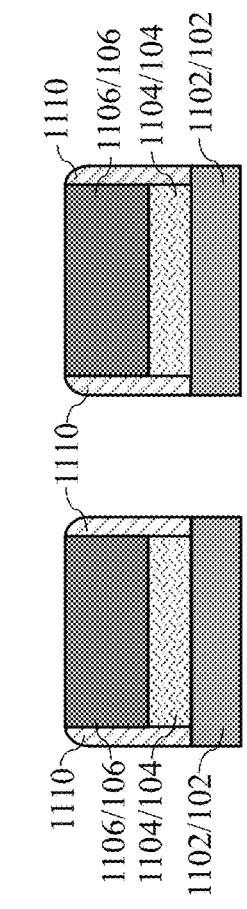

Referring to FIG. 11D, the method may further include forming a first intermediate insulating layer 1112*a*. This may be done by depositing electrically insulating material over the second electrodes 106 and smoothing a top surface of the electrically insulating material using for example, a CMP process. The smoothing process may further remove parts of the liner 1110 and the remaining parts of the liner 1110 may form the switching layers 108. As shown in FIG. 11D, the smoothing process may horizontally align the top surfaces of the second electrodes 106, the switching layers 108 and the intermediate insulating layer 1112*a*.

Figure 11E:
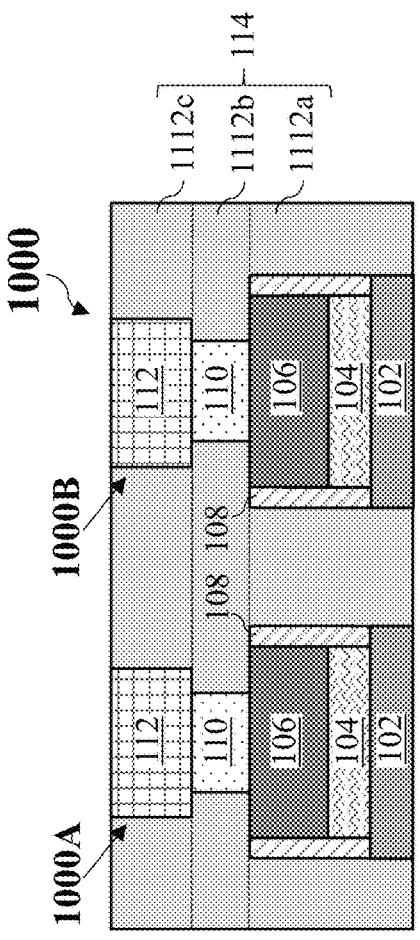

Referring to FIG. 11E, the method may further include depositing electrically insulating material over the first intermediate insulating layer 1112*a* to form a second intermediate insulating layer 1112*b*. The second intermediate insulating layer 1112*b* may be etched to form openings/trenches and these openings/trenches may be filled with electrically conductive material to form the connectors 110. The method may further include depositing electrically insulating material over the second intermediate insulating layer 1112*b* to form a third intermediate insulating layer 1112*c*. This third intermediate insulating layer 1112*c* may be etched to form openings/trenches and these openings/trenches may be filled with electrically conductive material to form the conductive lines 112. The remaining portions of the first, second and third intermediate insulating layers 1112*a*, 1112*b*, 1112*c* may form the insulating layer 114.

The above described order for the method is only intended to be illustrative, and the method is not limited to the above specifically described order unless otherwise specifically stated.

Figure 12:
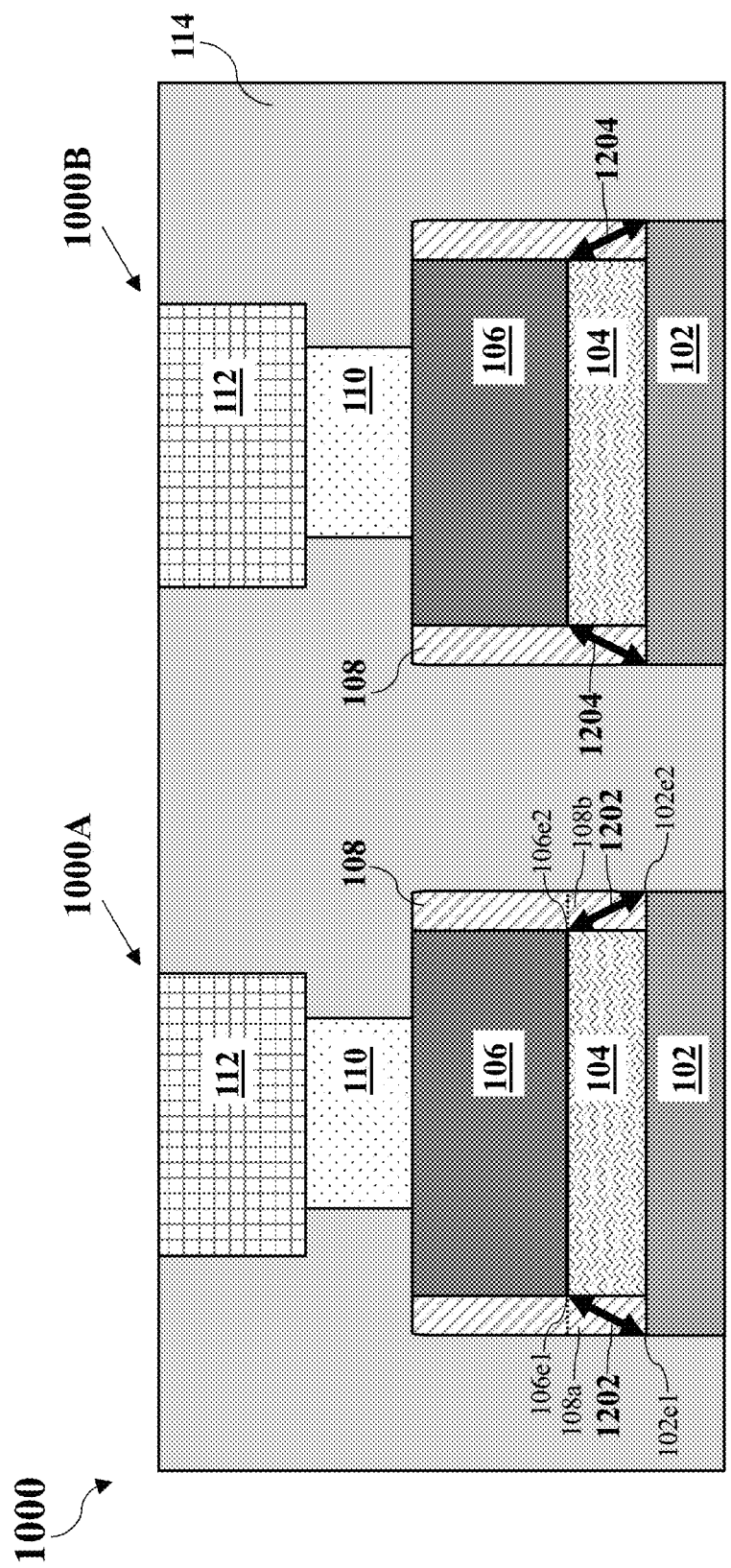
FIG. 12 shows a simplified cross-sectional view of the memory structure of FIG. 10 in operation.

FIG. 12 shows a simplified cross-sectional view of the memory structure 1000 in operation. For clarity of illustration, some reference numerals are omitted from FIG. 12. As shown in FIG. 12, the memory structure 1000 may operate in a similar manner as the memory structure 700, with the conductive filaments 1202, 1204 confined between the edges 102*e*1, 106*e*1 of the electrodes 102, 106 and between edges 102*e*2, 106*e*2 of the electrodes 102, 106 in each memory device 1000A, 1000B. Similar to the memory structure 700, the conductive filaments 1202, 1204 formed in the memory structure 1000 may be longer than those formed in the memory structure 100, as they may be formed along longer diagonal paths.

Figure 13B:
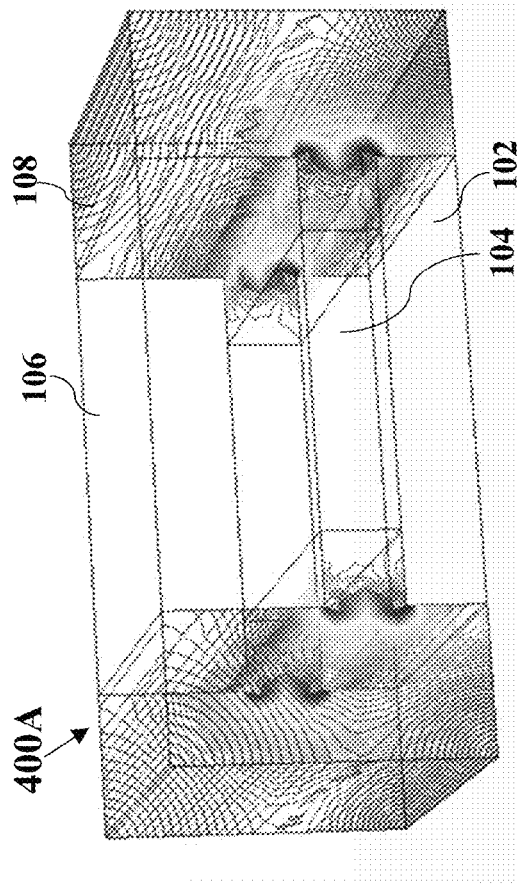
FIG. 13A, FIG. 13B and FIG. 13C respectively shows simulated electric fields in a memory device of the memory structure of FIG. 1, FIG. 4 and FIG. 7.
Figure 13A:
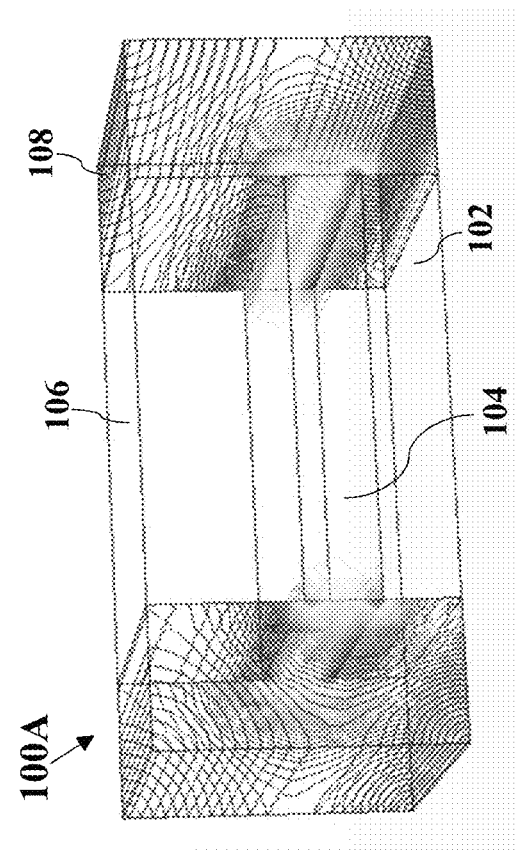
Figure 13C:
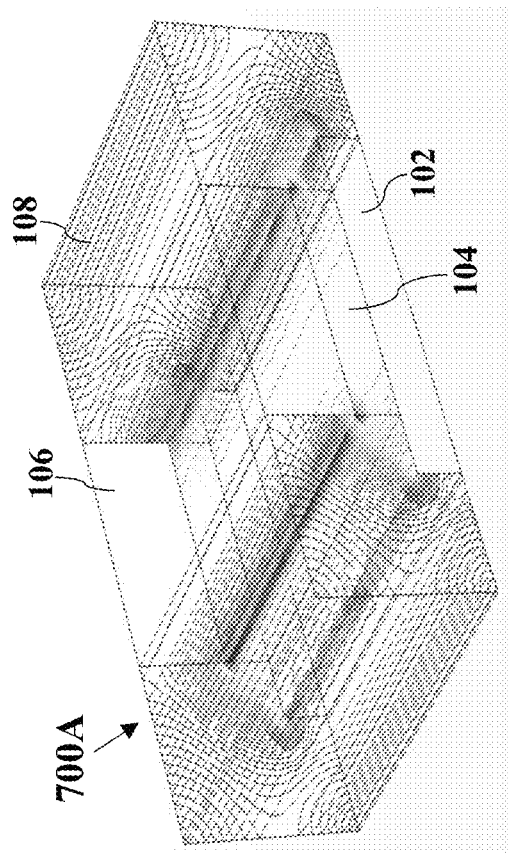

FIGS. 13A, 13B, 13C respectively shows simulated electric fields in the first memory device 100A of the memory structure 100, the first memory device 400A of the memory structure 400 and the first memory device 700A of the memory structure 700, when a sufficiently large potential difference is applied between the first and second electrodes 102, 106. As shown in FIGS. 13A, 13B, 13C, the electric field strengths at the first and second top edges 102*e*1, 102*e*2 of the first electrode 102 and the electric field strengths at the first and second bottom edges 106*e*1, 106*e*2 of the second electrode 106 may be higher than the electric field strengths at other parts of the memory device 100A, 400A, 700A. These higher electric field strengths may provide a pathway for the conductive filaments 302, 304, 602, 604, 902, 904 to form between the edges 102*e*1, 106*e*1 and between the edges 102*e*2, 106*e*2. Accordingly, formation of the conductive filaments 302, 304, 602, 604, 902, 904 may be confined between the edges 102*e*1, 106*e*1 and between the edges 102*e*2, 106*e*2, where the electric field strengths are the highest.

Figure 14:
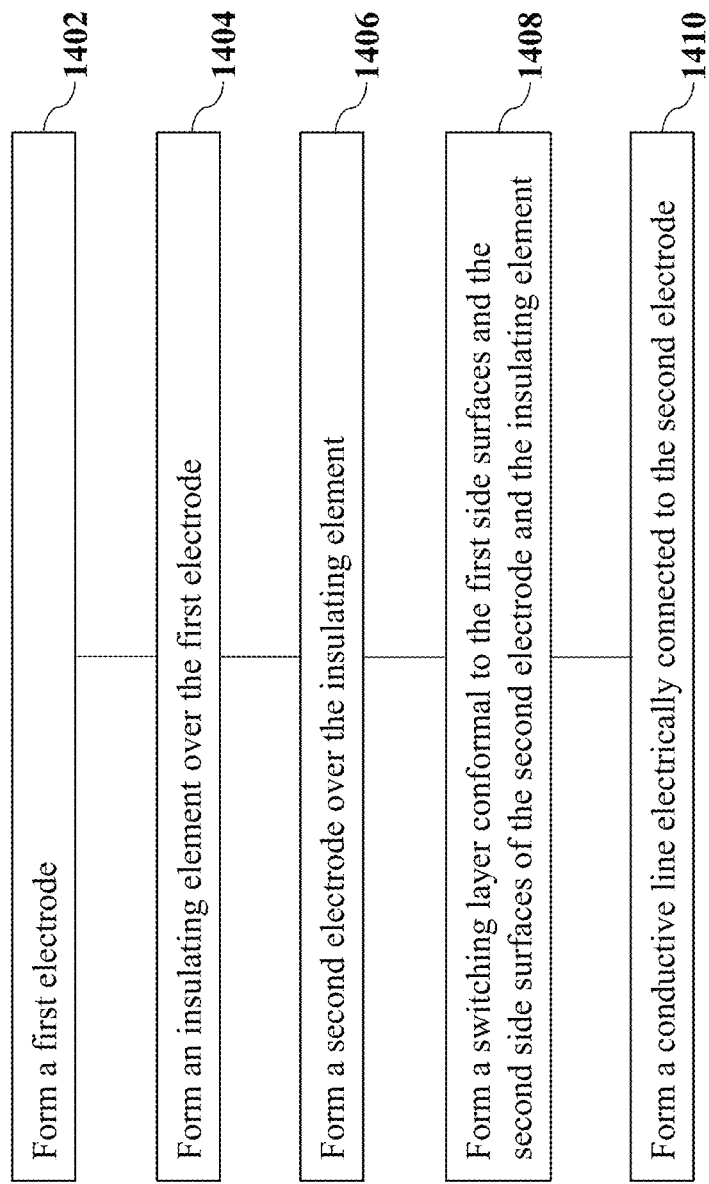
FIG. 14 shows a flow diagram illustrating a method of fabricating a memory device according to various non-limiting embodiments.

FIG. 14 shows a flow diagram of a method of fabricating a memory device according to various non-limiting embodiments.

At 1402, the method may include forming a first electrode. The first electrode may for example, be the first electrode 102 described above, and 1402 may include the processes described with reference to FIGS. 2A to 2B, FIG. 5A, FIGS. 8A to 8C or FIGS. 11A to 11C.

At 1404, the method may include forming an insulating element over the first electrode. The insulating element may for example, be the insulating element 104 described above, and 1404 may include the processes described with reference to FIGS. 2A to 2B, FIG. 5A, FIG. 8A or FIG. 11A.

At 1406, the method may include forming a second electrode over the insulating element. The second electrode may for example, be the second electrode 106 described above, and 1406 may include the processes described with reference to FIGS. 2A to 2B, FIG. 5A, FIG. 8A or FIG. 11A.

At 1408, the method may include forming a switching layer conformal to the first side surfaces and the second side surfaces of the second electrode and the insulating element. The switching layer may for example, be the switching layer 108 described above, and 1408 may include the processes described with reference to FIGS. 2C-2E, FIGS. 5C—5E, FIGS. 8E-8F or FIGS. 11B-11D.

At 1410, the method may include forming a conductive line electrically connected to the second electrode. The conductive line may for example, be the conductive line 112 described above, and 1410 may include the processes described with reference to FIG. 2E, FIG. 5E, FIG. 8F, or FIG. 11E.

By arranging the first electrodes 102, the insulating elements 104 and the second electrodes 106 in the above-described manner in the memory structures 100, 400, 700, 1000, the conductive filaments 302, 304, 602, 604, 902, 904, 1202, 1204 may be confined between the edges 102*e*1, 106*e*1 and between the edges 102*e*2, 106*e*2 of the electrodes 102, 106. In each memory structure 100, 400, the conductive filaments 302, 304, 602, 604 may in addition extend along vertical paths between the electrodes 102, 106, where these vertical paths may be shortest switching paths within the memory structure 100, 400. The thickness $T_{190}/T_{108}$ of the switching liner 190/switching layers 108 may also be controlled during the fabrication process and may not be limited by lithography. Hence, thin switching liners 190/switching layers 108 may be obtained. Accordingly, the filament paths in the memory structures 100, 400, 700, 1000 may be more stable and controlled. This may help to reduce the switching voltages of the memory devices 100A, 100B, 400A, 400B, 700A, 700B, 1000A, 1000B and may also reduce the variability in the resistance of the memory devices 100A, 100B, 400A, 400B, 700A, 700B, 1000A, 1000B especially in the HRS.

Further, each of the memory structures 100, 400, 700, 1000 may be formed by a CMOS compatible stack process. For example, as described above, each of the memory structures 100, 400, 700, 1000 may be formed by a method that may begin by forming layers of first, second and third materials (e.g. layers 202, 204, 206) and forming first, second and third elements (e.g. elements 208, 210, 212) from these layers. One of the first, second and third elements may be the second electrode 106 and another one of the first, second and third elements may be the insulating element 104. The formation of these elements may be performed in a single process, hence simplifying the fabrication process of the memory structures 100, 400, 700, 1000. In addition, self-aligned pillars of the first, second and third elements may be formed, and when forming the memory structures 700, 1000, the first electrodes 102 may be formed by a self-aligned process. Hence, misalignment between the electrodes 102, 106 and the insulating element 104 may be reduced. Further, only a single mask may be required in the fabrication process of each memory structure 100, 400, 700, 1000. For example, a mask may be used to etch the layers (e.g. layers 208, 210, 212) to form the first, second and third elements (e.g. elements 208, 210, 212) and no mask may be required for the rest of the fabrication process.

It is understood that although each of FIGS. 1, 4, 7, 10 shows two memory devices 100A, 100B/400A, 400B/700A, 700B/1000A, 1000B, each memory structure 100, 400, 700, 1000 may alternatively include fewer (e.g. one memory device) or more memory devices, and may thus have a different number of bits. Further, each memory structure 100, 400, 700, 1000 may be arranged with other memory structures 100, 400, 700, 1000 in various configurations, such as, but not limited to, a cross-bar configuration, a one-selector-one-resistor (1S1R) configuration, a one-selector-n-resistors (1SnR) configuration.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
a first electrode;
an insulating element arranged over the first electrode;
a second electrode arranged over the insulating element;
wherein each of the first electrode, the insulating element, and the second electrode comprises a first side surface and a second side surface; wherein centers of the first electrode, the insulating element, and the second electrode are substantially vertically aligned; and wherein the first side surface and the second side surface of the second electrode are substantially vertically aligned with the first side surface and the second side surface of at least one of the insulating element and the first electrode;
a switching layer conformal to the first side surfaces and the second side surfaces of the second electrode and the insulating element; and
a conductive line electrically coupled to the second electrode,
wherein each of the first electrode, the insulating element, and the second electrode are cuboidal.

2. The memory device of claim 1, wherein the switching layer comprises:
a first part conformal to the first side surface of the insulating element and arranged over a first top edge of the first electrode; and
a second part conformal to the second side surface of the insulating element and arranged over a second top edge of the first electrode.

3. The memory device of claim 1, wherein the switching layer is additionally conformal to the first side surface and the second side surface of the first electrode.

4. The memory device of claim 1, wherein a width of the first electrode, a width of the insulating element, and a width of the second electrode are equal.

5. The memory device of claim 1, wherein a width of the first electrode and a width of the second electrode are equal; and wherein a width of the insulating element is less than a width of the first electrode.

6. The memory device of claim 5, wherein a portion of the switching layer is arranged between the first electrode and the second electrode, conformal to the first side surface and the second side surface of the insulating element.

7. The memory device of claim 1, wherein a width of the second electrode and a width of the insulating element are equal; and wherein a width of the first electrode is greater than a width of the second electrode.

8. The memory device of claim 7, wherein the switching layer is additionally conformal to a top surface of the first electrode.

9. The memory device of claim 1, wherein the switching layer is arranged entirely over the first electrode.

10. The memory device of claim 1, wherein the memory device comprises a resistive random access memory device.

11. A memory structure comprising a plurality of memory devices, wherein each memory device comprises:
a first electrode;
an insulating element arranged over the first electrode;
a second electrode arranged over the insulating element;
wherein each of the first electrode, the insulating element, and the second electrode comprises a first side surface and a second side surface; wherein centers of the first electrode, the insulating element and the second electrode are substantially vertically aligned; and wherein the first side surface and the second side surface of the second electrode are substantially vertically aligned with the first side surface and the second side surface of at least one of the insulating element and the first electrode;
a switching layer conformal to the first side surfaces and the second side surfaces of the second electrode and the insulating element; and
a conductive line electrically connected to the second electrode,
wherein each of the first electrode, the insulating element, and the second electrode are cuboidal.

12. The memory structure of claim 11, wherein the switching layer of each memory device comprises a part of a switching liner extending continuously across the plurality of memory devices.

13. The memory structure of claim 11, wherein an electrically insulating material is arranged between the switching layers of adjacent memory devices.

14. A method of fabricating a memory device, the method comprising:
forming a first electrode;
forming an insulating element over the first electrode;
forming a second electrode over the insulating element;
wherein each of the first electrode, the insulating element, and the second electrode comprises a first side surface and a second side surface; wherein centers of the first electrode, the insulating element and the second electrode are substantially vertically aligned; and wherein the first side surface and the second side surface of the second electrode are substantially vertically aligned with the first side surface and the second side surface of at least one of the insulating element and the first electrode;
forming a switching layer conformal to the first side surfaces and the second side surfaces of the second electrode and the insulating element; and forming a conductive line electrically connected to the second electrode, wherein each of the first electrode, the insulating element, and the second electrode are cuboidal.

15. The method of claim 14, further comprising:

forming a first layer of a first material;

forming a second layer of a second material over the first layer;

forming a third layer of a third material over the second layer; and forming a first element from the first layer, a second element from the second layer, and a third element from the third layer in a single process;

wherein one of the first element, the second element, and the third element is the second electrode; and wherein another of the first element, the second element and the third element is the insulating element.

16. The method of claim 15, wherein the first element is the first electrode, the second element is the insulating element and the third element is the second electrode.

17. The method of claim 16, further comprising reducing a width of the insulating element.

18. The method of claim 15, wherein the first element is the insulating element, the second element is the second electrode, and the third element is a further insulating element.

19. The method of claim 18, further comprising:

forming an electrode layer comprising an electrode material, wherein the first layer is formed over the electrode layer;

forming a liner over the third element; and forming the first electrode from the electrode layer with a self-aligned process using the liner as a guide.

20. The memory device of claim 1, wherein the first and second electrodes comprise a metal, metal nitride or alloy thereof.

* * * * *